United States Patent [19]

Cherry

[11] Patent Number: 4,458,293
[45] Date of Patent: Jul. 3, 1984

[54] CAPACITIVE KEYBOARD
[75] Inventor: Walter L. Cherry, Winnetka, Ill.
[73] Assignee: Cherry Electrical Products Corporation, Waukegan, Ill.
[21] Appl. No.: 379,059
[22] Filed: May 17, 1982

Related U.S. Application Data
[63] Continuation-in-part of Ser. No. 318,483, Nov. 5, 1981, abandoned.
[51] Int. Cl.³ ............................ H01G 5/14; B41J 5/08
[52] U.S. Cl. .................................. 361/288; 340/365 C
[58] Field of Search .................... 361/288; 340/365 C; 400/479.1; 200/159 B, DIG. 1; 307/116

[56] References Cited
U.S. PATENT DOCUMENTS

| | | | |
|---|---|---|---|
| 3,653,038 | 3/1972 | Webb et al. | 340/365 |
| 3,659,163 | 4/1972 | Borisov et al. | 361/288 |
| 3,797,630 | 3/1974 | Zilkha | 340/365 C X |
| 4,083,100 | 4/1978 | Flint et al. | 200/DIG. 1 X |
| 4,209,819 | 6/1980 | Seignemartin | 361/288 |

FOREIGN PATENT DOCUMENTS 57-55014  4/1982  Japan .
 654950  3/1979  U.S.S.R. .

OTHER PUBLICATIONS
I.B.M. Technical Disclosure Bulletin, vol. 24, No. 8, Jan. 1982, pp. 4014-4015.

Primary Examiner—Donald A. Griffin
Attorney, Agent, or Firm—Willian, Brinks, Olds, Hofer, Gilson & Lione Ltd.

[57] ABSTRACT

An improved capacitive keyboard includes a plurality of switch keys that each define a minimum capacitance when in a fully extended rest state and a maximum capacitance when pressed. Each switch key has a plunger mechanism that compresses a capacitive spring when the key is pressed and releases the spring when the key is released. Each capacitive spring is affixed in operational orientation over an associated capacitive pad by soldering areas of the base coil of the spring to adjacent plated holes in a supporting printed circuit board. In operation, molten solder is applied at the underside of the printed circuit board and passes up through the plated holes by capillary action to contact the base coil of the spring. The hardened solder holds the spring in its operational position on the printed circuit board and conductively contacts the spring with an output terminal of the board.

17 Claims, 6 Drawing Figures

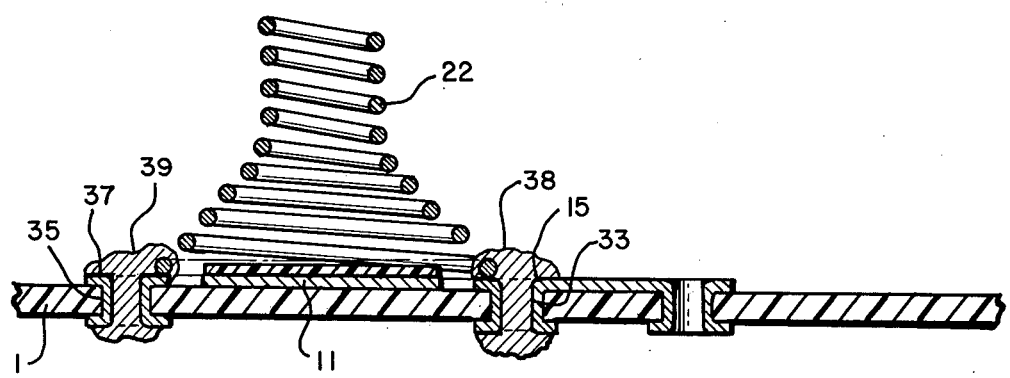
FIG. 3
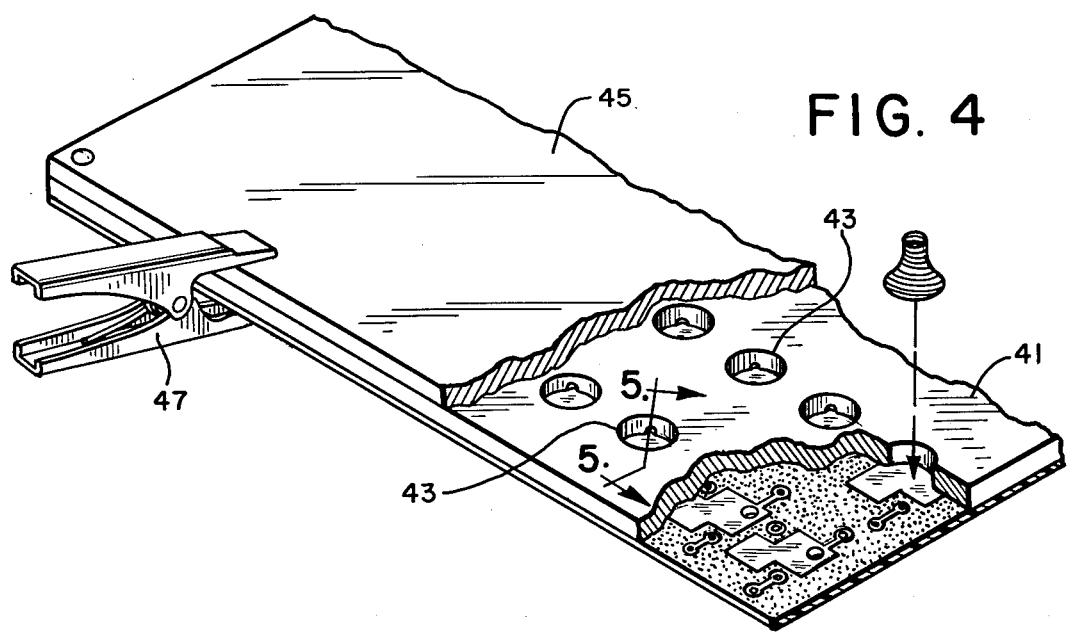
FIG. 4
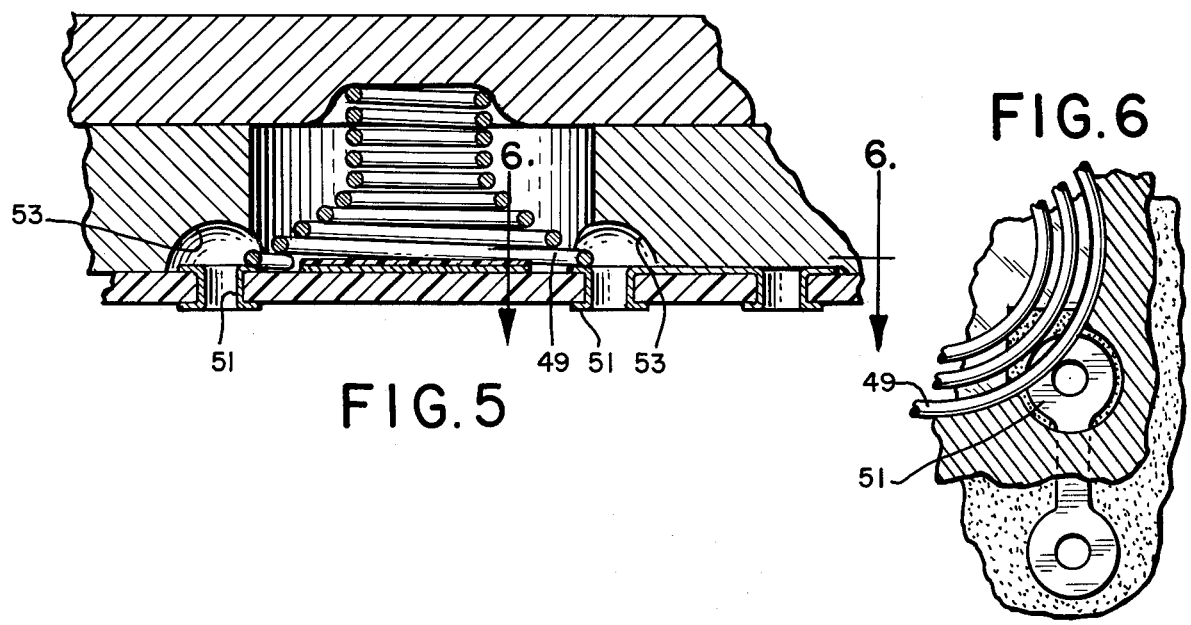
FIG. 5
FIG. 6

CAPACITIVE KEYBOARD

CROSS REFERENCE TO RELATED APPLICATION

This application is a continuation-in-part of a prior copending U.S. application Ser. No. 318,483, filed Nov. 5, 1981, and now abandoned.

TECHNICAL FIELD OF THE INVENTION

The invention generally relates to keyboards with switch keys that define one capacitance when at rest and a different capacitance when activated. More particularly, the invention relates to such a capacitive keyboard wherein the capacitance of each key is defined by the position of a spring within the key.

BACKGROUND OF THE INVENTION

Capacitive keyboards typically have many switch keys which may be pressed and released to respectively define active and inactive switch states. Each switch key has a capacitive element that defines a low capacitance when the key is inactive and a relatively higher capacitance when the key is pressed. The change in capacitance of a key therefore indicates the operational state of the key.

Capacitive keyboards are desirable because of their structural simplicity and their associated relatively low manufacturing cost. Also, capacitive keyboards have a potentially higher reliability and a longer life then keyboards with keys that physically make and break conductive connections.

The above-referenced parent patent application Ser. No. 318,483, filed Nov. 5, 1981, shows several embodiments of an improved capacitive keyboard and associated switch keys that have many desirable features. One such embodiment of a switch key utilizes a spring to define a capacitance which indicates the operational state of the key. In operation, when the key is at rest, the spring is fully extended to define a minimum capacitance with respect to an underlying dielectric sheet and stationary capacitor plate. When the key is pressed, the spring is compressed so that its coils spread out over the dielectric sheet and the underlying capacitor plate. The compressed coils of the spring are disposed adjacent to the underlying plate and therefore define an increased capacitance for as long as the key is pressed.

The spring for each switch key of the disclosed capacitive keyboard is connected to an underlying printed circuit board by inserting a downwardly extending end of the spring into a plated hole of the board and soldering the end of the spring in the hole. In manufacturing such a capacitive key, the spring must first be carefully positioned on the printed circuit board and rotated until its downwardly extending end slips into its associated solder hole. If the keyboard has many keys, it can take a substantial amount of time to align and solder all of the springs to the board. The alignment process therefore adds to the cost of manufacturing.

Moreover, if the spring is rotated slightly when its end is in the printed circuit board, the body of the spring will move out of alignment with respect to its underlying capacitor plate and will therefore have to be realigned prior to soldering. Such realignment further reduces manufacturing efficiency and increases manufacturing costs.

Accordingly, it is an object of the invention to provide a relatively simple, inexpensive and rapid means for conductively affixing capacitive springs to a printed circuit board of a capacitive keyboard.

Another object of the invention is to provide a printed circuit board of a capacitive keyboard with plated holes that are positioned adjacent to the outer edge of the base of a capacitive spring to pass molten solder to the spring and thereby conductively connect the spring to the circuit board.

A further object of the invention is to provide a manufacturing process whereby capacitive springs may be easily aligned and conductively affixed to a printed circuit board of a capactive keyboard.

Another object of the invention is to provide a capacitive switch with a capacitive spring which is positioned in relation to an underlying capacitive plate to maximize the difference between a switch capacitance defined when the spring is compressed and a switch capacitance defined when the spring is released.

SUMMARY OF THE INVENTION

In order to achieve the objects of the invention and to overcome the problems of the prior art, a preferred embodiment of a capacitive switch key includes a switch body that contains a capacitive spring and a plunger that slides into and out of the body and that rests on top of the spring. The spring biases the plunger outwardly and therefore fully extends the plunger outside the housing when the switch key is at rest. When the plunger is pressed into the housing, the spring is compressed against an underlying capacitive pad that is supported on a circuit board.

The capactive pad is comprised of a metal capactive plate that is disposed on the top surface of the circuit board and a dielectric sheet or membrane that covers the capacitive plate. The capacitive spring and capacitive pad are dimensioned so that when the key switch is inactive, a minimum area of contact is defined between the spring and the pad. When the plunger of the switch key is pressed, and coils of the capacitive spring are compressed and are therefore flexed against the dielectric surface of the pad. The proximity of the coils to the surface of the capacitive pad increases the capacitance of the switch key and thereby indicates that the key is activated.

Plated holes are formed through the printed circuit board and are positioned adjacent to the outer coil of the base of the capacitive spring. Each hole has a peripheral flange upon which a portion of the base of the spring rests. The spring is affixed to the printed circuit board by molten solder which passes up through the plated holes and over the associated flanges to the base of the spring. The solder hardens to conductively connect the plated holes and the spring.

In manufacturing, capacitive springs are aligned on a printed circuit board by a jig which has holes that are dimensioned to receive the bases of the springs. The jig is aligned on the circuit board and springs are placed in the holes at their proper keyboard positions. A pressure plate is then positioned over the jig and is lowered to compress the springs against the underlying printed circuit board. Clamps are applied to hold the pressure plate, jig, and printed circuit board together. Molten solder is thereafter applied to plated holes of the printed circuit board to affix the capacitive springs to the board.

BRIEF DESCRIPTION OF THE DRAWINGS

FIG. 3 illustrates a cross-sectional view of a capacitive spring mounted in accordance with the invention, taken along a line 3—3 of FIG. 1.

FIG. 4 illustrates a perspective view of a printed circuit board and apparatus for conductively affixing capacitive springs to the board.

FIG. 5 illustrates a cross-sectional view of the capacitive spring mounting apparatus of FIG. 4, taken along a line 5—5.

FIG. 6 illustrates a cross-sectional view of a portion of the apparatus of FIG. 5, taken along a line 6—6.

DETAILED DESCRIPTION OF PREFERRED EMBODIMENTS

Figure 1:
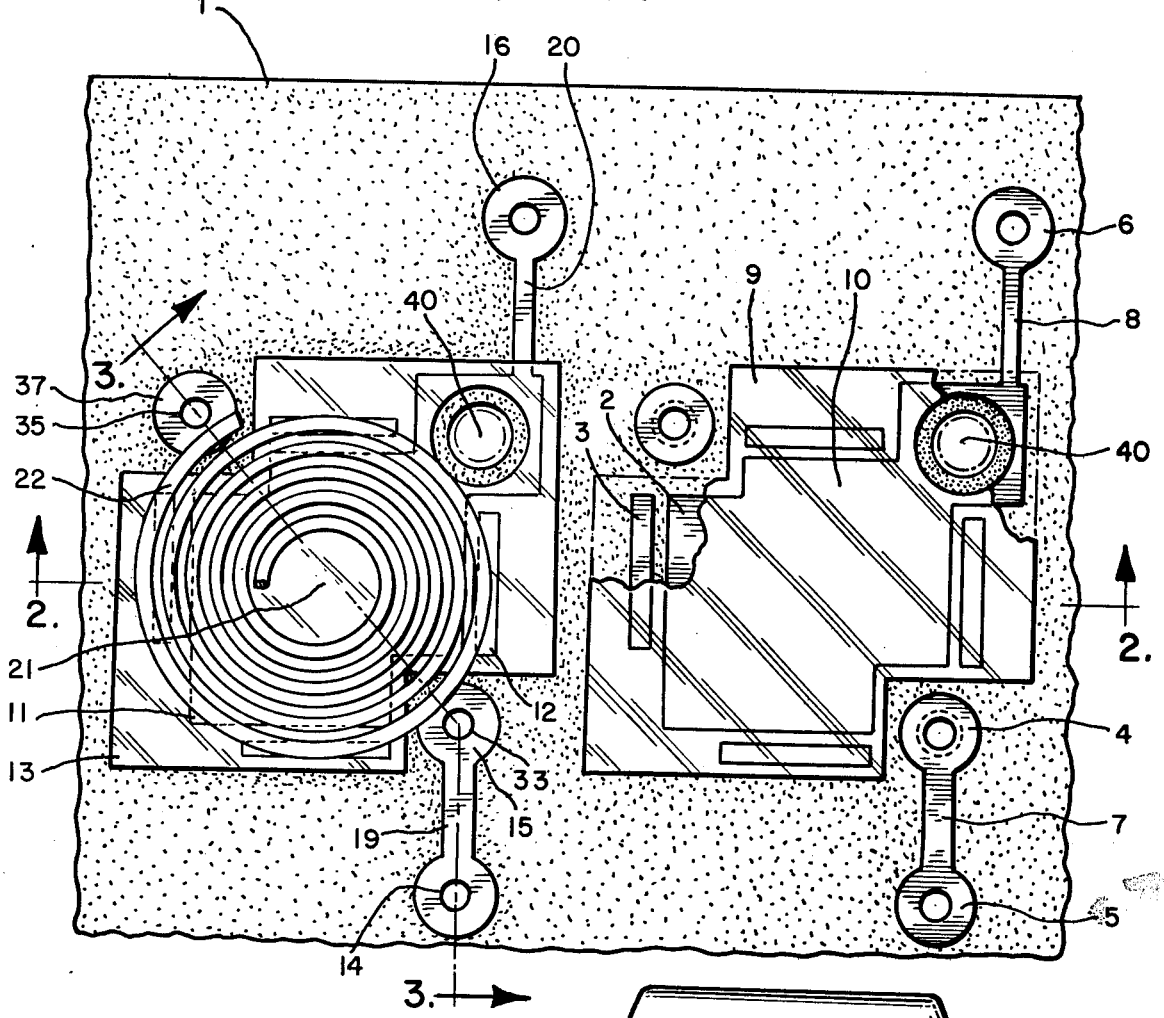
FIG. 1 illustrates a top elevation, partial cut-away view of a printed circuit board and one capacitive spring positioned over the board in accordance with the invention.

The remaining portion of the specification will describe preferred embodiments of the invention when read in conjunction with the attached drawings, in which like reference characters designate identical apparatus.

FIG. 1 illustrates a top elevation, partial cutaway view of a portion of a printed circuit board 1 of a preferred embodiment of the capacitive keyboard of the invention. The printed circuit board is a relatively rigid panel that supports conductive forms which are produced on the surface of the panel by known photolithographic techniques. Thus, the board 1 supports a conductive capacitive plate 2, conductive support bars 3 positioned in insulated, spaced relation to the plate 2, and conductive eyelets 4, 5 and 6. The eyelets 4 and 5 are conductively connected by an intermediate conductive trace 7 and the eyelet 6 is conductively connected to the plate 2 by a conductive trace 8. A dielectric sheet or membrane 9 covers the plate 2, bars 3 and a portion of the underlying board 1. For purposes of discussion, the plate 2 and overlying dielectric sheet 9 will be collectively referred to as a capacitive pad 10.

A second conductive plate 11 is shown in insulated, spaced relation to the plate 2. The plate 11 and an overlying dielectric sheet 13 form a capacitive pad 21. The pad 21 has support bars 12, eyelets 14, 15 and 16 and traces 19 and 20 in the same relative positions as described for the pad 10.

The capacitive pad 21 is illustrated with an overlying capacitive spring 22. The outer base coil of the spring 22 rests on the support bars 12 outside the area of the pad 21 and the remaining coils of the spring are supported in spaced relation over the pad. In a preferred embodiment of the invention, the bars 12 are formed of the same conductive material and with the same thickness as the plate 11. The dielectric sheet 13 covers the bars so that their support surface is at the same level as the top surface of the capacitive pad 21. Thus, the bars support the spring in stable relation to the underlying plate 11. The spring 22 may alternatively be supported by a structure made of insulating material, and positioned to support the base coil of the spring outside the area of the plate.

Figure 2:
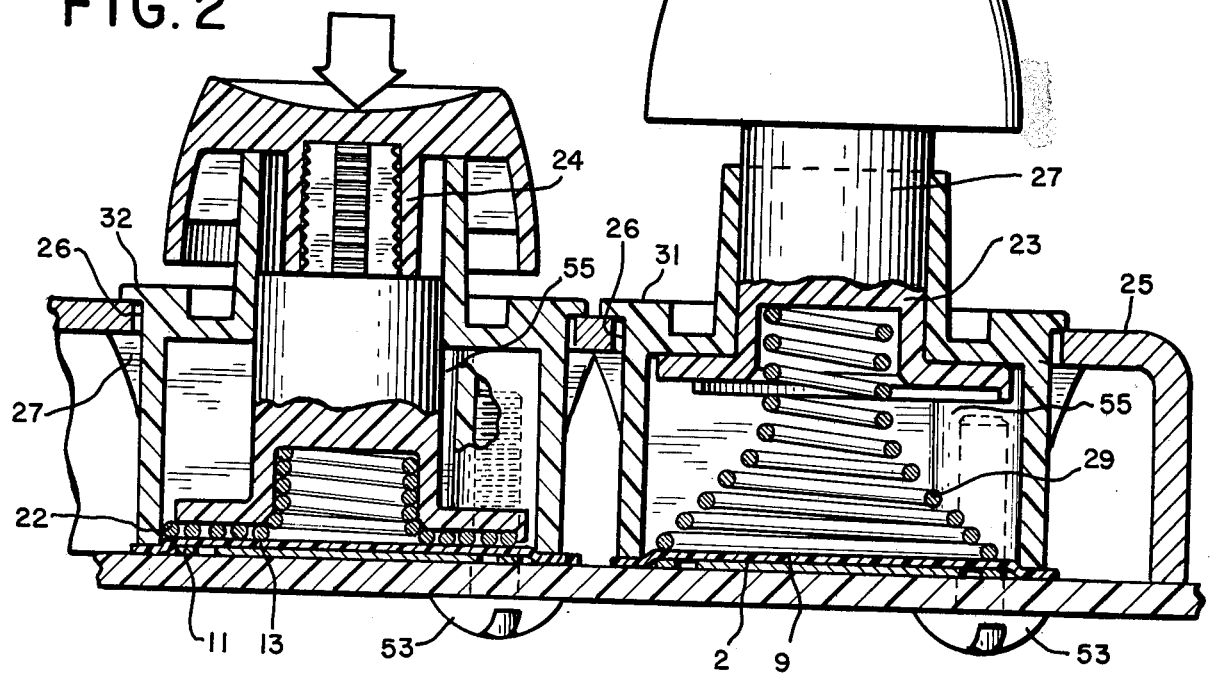
FIG. 2 illustrates a cross-sectional view of a preferred embodiment of two switch keys of an assembled keyboard, taken along a line corresponding to the line 2—2 of FIG. 1.

As shown in FIG. 2, the capacitive pad 10 has a capacitive spring 29 supported on the bars 3 and positioned as shown for the spring 22. The spring 29 is omitted from FIG. 1 in order to provide an unobstructed view of the pad 10 and its support bars 3.

The capacitive springs 22 and 29 are preferably made of stainless steel with a copper coating applied, for example by electroplating. The stainless steel springs resist corrosion and maintain their resiliency over a relatively long life. Moreover, the copper coating provides a lubricated surface and thereby facilitates the formation of the springs. The copper plated springs are also readily soldered to facilitate conductive mounting on the printed circuit board.

It should generally be understood that the printed circuit board 1 may be made any desired size and may include any desired number of capacitive pads and associated capacitive springs. Thus, the two capacitive pads and single spring of FIG. 1 are shown merely to facilitate an understanding of the invention and are not intended to limit the invention to a particular number of pads and springs.

The physical relationship of the springs 22 and 29 and their respective underlying pads 21 and 10 may be better understood by reference to a cross-sectional view of a portion of a capacitive keyboard which is illustrated in FIG. 2. The cross-sectional view of FIG. 2 is taken along a line corresponding to the line 2—2 of FIG. 1. As shown in FIG. 2, two switch keys 23 and 24 are mounted in a front panel 25 through apertures 26 which are dimensioned to pass the respective housings 31 and 32 of the switch keys. Each of the switch keys has resilient locking tabs 27 which are compressed inwardly when the housing of the key is passed through its aperture of the front panel 25. The tabs spring outwardly to lock the housing within the front panel when the bottom of the housing abutts the printed circuit board 1 in position over an associated capacitive pad.

The switch key 23 of FIG. 2 has a plunger mechanism with a shaft 27 that is slidingly retained in the housing 31 of the key. An end cap 28 is affixed at the free end of the shaft. The key 23 of FIG. 2 is shown in its inactive state, with the shaft 27 supported by the capacitive spring 29 and biased to a fully extended position outside the housing.

When the switch key 23 is in the inactive state shown in FIG. 2, the outer base coil of the spring 29 is supported by the bars 3 outside the area of the plate 2 and all of the inner movable coils of the spring are supported above the plate 2 and the overlying dielectric sheet 9. In the inactive state the spring 29 and its underlying capacitive plate 2 define a minimum capacitance which may be monitored by a capacitance monitoring circuit (not shown) connected across the plate and spring. The conductive bars 3 do not contribute to the capacitance of the plate, because they are positioned in insulated, spaced relation to the plate. The inactive state of the key is therefore characterized by a near zero capacitance. This near zero capacitance is desirable because it defines an inactive switch state that is relatively easy to detect.

As shown in FIG. 2, the switch key 24 is pressed so that its shaft is fully extended into its housing 32 and its capacitive spring 22 is compressed. When the spring 22 is compressed, several of its inner coils are pressed down over the underlying pad 21. The compressed inner coils form a capacitor plate in close association with the plate 11 and therefore define a maximum capacitance for the key 24. The above-mentioned capacitance monitoring circuit (not shown) is connected across the spring 22 and plate 11 to sense the increased capacitance and provide an electrical indication that the key 24 has been activated.

Each of the conductive springs of the printed circuit board 1 is soldered to a conducting output terminal of the circuit board. As shown in the enlarged cross-sectional view of FIG. 3, the spring 22 is held in operative position with respect to its underlying capacitive plate 11 by soldered connections through the plated hole 33 of the eyelet 15 and the plated hole 35 of an eyelet 37 of the circuit board 1. The plated holes 33 and 35 extend through the printed circuit board and have respective conducting eyelet flanges that are disposed on the surface of the board. In operation, molten solder 38 and 39 flows up the plated holes 33 and 35 by capillary action and spreads over the flanges of the respective eyelets 15 and 37 to contact the base of the spring 22. Thereafter the solder hardens to conductively affix the spring to the eyelets.

As explained above, the eyelet 15 is conductively connected to an output terminal eyelet 14 by an intermediate conductive trace 19. The capacitance monitoring circuit is connected to the eyelet 14 and is thus conductively connected to the spring 22 through the solder 38.

In manufacturing, molten solder is applied at the back of the board 1 to the holes 33 and 35, for example by means of a wave solder process known in the art. It should be understood that the base of the spring does not have to pass over the holes in order to effectuate a satisfactory solder connection. The base of the spring need only contact the flanges of the eyelets 15 and 37 in order to receive the flow of solder up through the respective holes.

As shown in FIG. 1, the printed circuit board has openings 40 that are dimensioned to pass screws 53, for example as illustrated in FIG. 2. The screws 53 pass up through the printed circuit board and screw into associated walls 55 of the housings of the switch keys 23 and 24. The screws 53 are provided to insure that there is a close contact between the base of the housing of a switch key and its underlying printed circuit board. Many switch key housings do not require a screw 53 to maintain the necessary close contact with the printed circuit board, because the dimensioning of the front panel 25, resilient locking tabs 27 and switch housing is sufficient to wedge the base of the housing firmly against the board. However, if the printed circuit board is expected to flex in a particular area, switch key housings in the area might require screw connections to maintain their housing bases in contact with the board. Thus, for example, if a relatively long printed circuit board is employed, the center of the board might be expected to flex or sag and therefore the switch key housings in the central area could be screwed to the board.

If the screw 53 is made of a conducting material, it should be insulated from its associated capacitive plate so that it does not affect the capacitance of the switch key. Thus, for example, the opening 40 of FIG. 1 is not plated and therefore the associated metal screw 53 is not conductively connected with the capacitive plate 11.

The capacitive plate 11 is conductively connected to an eyelet 16 which defines the output terminal for the capacitive plate 11 and which is conductively connected to the capacitance monitoring circuit.

FIG. 4 illustrates a simple apparatus which may be employed in a manufacturing process to easily locate and solder many springs on a supporting printed circuit board. The apparatus is shown with respect to two springs for simplicity of illustration. However, it should be understood that the apparatus and process may be employed to affix any desired number of springs to a printed circuit board.

In operation, a locator jig 41 is placed on the printed circuit board 1 and is aligned with the printed circuit board so that openings 43 of the jig are located at respective positions for capacitive springs. Each of the openings 43 is dimensioned to receive and pass the base coil of a spring. Moreover, the springs and openings of the jig may be color coded so that particular desired sizes of springs can be easily placed at required positions on the printed circuit board.

When all of the springs have been placed in their respective holes of the jig 41, a solid compression plate 45 is pressed against the springs to firmly hold them against the printed circuit board and adjacent to the plated mounting holes through which they will be soldered to the board. Clamps 47 are provided to hold the printed circuit board 1, locator jig 41 and compression plate 45 in contact. The capacitive springs are thereafter soldered at their respective locations by applying molten solder to the underside of the board at the plated mounting eyelets.

FIG. 5 illustrates a cross-sectional view of the spring mounting apparatus taken along a line 5—5. As shown in FIG. 5, a spring 49 is mounted in contact with the flanges of its associated eyelets 51. Voids are provided to allow beads of solder to form at the surface of the printed circuit board in contact with the base of the spring. FIG. 6 shows an additional cross-sectional view of the apparatus of FIG. 5 to illustrate the positioning of the outer coil of the spring 49 over the flanges of the eyelets 51.

After the springs have all been soldered to the printed circuit board, the clamps, compression plate and locator jig are removed and the operation of each of the capacitive springs is tested by measuring the minimum capacitance of each spring at rest and then pressing the springs and measuring their associated maximum capacitance. After the springs are tested, the printed circuit board is secured, for example by screws, within a keyboard housing having the front panel 25 of FIG. 2. Individual switch key housings are then pressed through associated apertures of the front panel and are snapped into place over their associated capacitive springs. As explained above, switch key housings located in sections of the printed circuit board that are likely to flex may be affixed to the board by screws 53.

The particular disclosed shapes and relative sizes of the springs and underlying capacitive plates and dielectric sheets are preferred for use in a relatively inexpensive and reliable capacitive keyboard. However, the invention is not necessarily limited to the disclosed relative sizes and shapes of the springs, underlying capacitive plates and dielectric sheets. Thus, it is expected that other sizes and shapes of such components could be employed without departing from the spirit of the invention.

Individual housings have been provided for each switch key in order to facilitate the manufacture of keyboards having different numbers of keys and different arrangements of keys. However, the invention is not necessarily limited to key switches which have individual housings.

Moreover, the invention is not limited to the particular described materials of the spring or even necessarily to the use of solder alone to affix the springs to the printed circuit board. In general, a spring of any desired conductive material could conceivably be employed and a molten conductive affixing material could be utilized to conductively contact the base of the spring to underlying plated holes in the manner generally described in the specification for solder.

Accordingly, the invention may be embodied in other specific forms without departing from its spirit or essential characteristics. The present embodiments are, therefore, to be considered in all respects as illustrative and not restrictive, the scope of the invention being indicated by the claims rather than by the foregoing description. All changes which come within the meaning and range of the equivalents of the claims are, therefore, intended to be embraced therein.

I claim:

1. A switch key, comprising:
   an insulating base;
   at least one conducting plate supported on the base;
   a dielectric sheet disposed over said plate;
   an electrically conducting conical spring having a base coil supported on said dielectric sheet and a plurality of movable coils arranged in spaced relation above the base coil and over said dielectric sheet and said conducting plate;
   at least one channel means for forming a passage through said insulating base, said channel means including a metal plated hole formed through said base and a metal flange extending from said hole to contact said base coil;
   a conducting output terminal;
   solder for flowing in a liquid state through said metal plated hole and contacting said base coil and for hardening to a solid state for conductively connecting said output terminal and said base coil; and
   means for compressing said spring in response to a switch activating force and releasing the spring when the activating force is removed, so that the movable coils of the spring define a capacitance when compressed that is distinguishable from a capacitance defined when the movable coils are released.

2. The switch key of claim 1, including means for conductively connecting said output terminal to said metal plated hole.

3. The switch key of claim 1, wherein said channel means includes two metal plated holes.

4. The switch key of claim 1, further including means for supporting said base coil outside an area defined by said conducting plate.

5. The switch key of claim 4, wherein said means for supporting includes a plurality of pedestal bars for defining a spring support surface that is at substantially the same level as the top surface of said conducting plate, said bars arranged in insulated relation to the plate and covered by said dielectric sheet.

6. A switch key, comprising:
   an insulating base;
   at least one conducting plate supported on the base;
   a dielectric sheet disposed over said plate;
   at least one electrically conducting channel means having a conducting passage formed through said base and a conductive flange exposed on the top surface of said base, said channel means including an electrically conducting output terminal;
   an electrically conducting spring and means for supporting said spring on said dielectric sheet and in contact with said conductive flange with at least a portion of the spring extending over said conducting plate;
   solder for flowing in a molten state through said conducting passage and over said flange to said spring and for hardening to conductively contact said conducting channel means and spring; and
   means for compressing said spring to define an activated switch key capacitance and for releasing said spring to define a distinguishable inactivated switch key capacitance.

7. The switch key of claim 6, including two of said channel means.

8. A switch key comprising:
   an insulating base;
   at least one conducting plate supported on the base;
   a dielectric sheet disposed over the plate;
   a conductive contact exposed on said base and conductively connected to a metal-plated hole formed through said base;
   movable plate means having a conductive base element resting on said dielectric sheet and a plurality of conducting movable elements conductively connected and supported in spaced relation above said dielectric sheet, said movable elements for collapsing to define a maximum capacitance in response to a compressive switch activating force and for returning to their spaced positions above the dielectric sheet to define a minimum capacitance when the force is removed; and
   solder for flowing in a molten state through said plated hole and over at least a portion of said contact to said base element and for hardening to conductively connect said contact and said base element.

9. A capacitive keyboard, comprising:
   an insulating base;
   a plurality of switch keys, each switch key including at least one conducting plate supported on said base,
   a dielectric sheet disposed over said plate,
   a housing,
   a plunger for slidingly moving into said housing to define an active switch state and for slidingly moving out of the housing to define an inactive switch state,
   a conductive spring for biasing said plunger outwardly and for defining with said conducting plate and said dielectric sheet a capacitance that is representative of said active and inactive switch states, and
   means for affixing said spring to said base, said means for affixing including at least one metal-plated hole through said base, a contact means conductively connected to said plated hole and including a conducting output terminal and a conducting flange contacting the base of said spring, and solder for flowing in a molten state through said plated hole and over said flange to the base of said spring and for hardening to conductively connect the spring and the output terminal.

10. The capacitive keyboard of claim 9, wherein said spring includes a base coil which surrounds the conducting plate and at least one additional coil suspended over the conducting plate and dielectric sheet for flexing against the sheet when the spring is compressed by said plunger.

11. The capacitive keyboard of claim 10, further including means for supporting said base coil at a level defined by said conducting plate and dielectric sheet.

12. The capacitive keyboard of claim 9, further including at least one screw for affixing the base of said housing to said insulating base.

13. A switch key, comprising:
at least one conducting plate;
a circuit board for supporting said conducting plate;
pedestal bars disposed around said conducting plate and in insulated spaced relation to the plate, the bars having substantially the same thickness as the plate;
a dielectric film covering said conducting plate and pedestal bars;
a conducting conical spring having a base surrounding said conducting plate and supported by said pedestal bars and including additional coils positioned above said dielectric film and overhanging said conductive plate;
actuator means for compressing said spring to define a predetermined switch actuating capacitance and for releasing the spring to define a predetermined distinguishable switch release capacitance;
at least one conductive passage formed through said circuit board;
at least one conductive contact supported on said circuit board abutting said base coil and conductively connected to said at least one conductive passage; and
solder for flowing in a molten state through said conductive passage and over said contact to said base coil and for hardening to conductively connect said spring and contact.

14. A method for constructing a capacitive keyboard, comprising the steps of:
placing a jig having spring alignment openings over a circuit board having a plurality of capacitive pads;
aligning the jig with respect to the circuit board so that alignment openings are positioned over respective capacitive pads;
placing capacitive springs in an upstanding orientation in their respective alignment openings of the jig, so that each spring contacts metal rims of associated metal-plated holes in the printed circuit board;
placing a compression plate over the jig and the upstanding springs;
clamping the compression plate, jig and circuit board together;
applying molten solder to openings of the metal-plated holes at the back side of the circuit board, so that the solder flows through the holes, over the rims of the holes and contacts the bases of the associated springs;
allowing the solder to harden to conductively connect the springs and their associated plated holes; and
removing the clamps, pressure plate and jig from the circuit board.

15. A capacitive switch, comprising:
at least one conducting plate;
an insulating dielectric sheet means disposed over said at least one conducting plate;
an electrically conducting coiled spring;
means for compressing said spring adjacent to said at least on conducting plate to define a predetermined activated switch capacitance and for releasing said spring to define a distinguishable inactivated switch capacitance; and
means for supporting said spring means in spaced relation to said at least one conducting plate for maximizing the difference between said activated switch capacitance and inactivated switch capacitance.

16. The capacitive switch of claim 15, wherein said coiled spring is conical in shape.

17. A capacitive switch, comprising:
at least one conducting plate means;
an insulating dielectric sheet means disposed over said at least one conducting plate means;
an electrically conducting helical spring for flexing between an expanded rest position and a compressed switch activation position, said spring having a base coil supported adjacent to said at least one conducting plate means and a plurality of movable coils positioned in spaced relation above the base coil in the rest position and in a telescopically collapsed relation in said switch activation position;
means for compressing said helical spring for defining a predetermined activated switch capacitance with respect to said at least one plate means and for releasing the helical spring for defining a distinguishable inactivated switch capacitance; and
means for supporting the base coil of said helical spring in spaced relation to said at least one conducting plate means for maximizing the difference between said activated switch capacitance and said inactivated switch capacitance.

* * * * *

UNITED STATES PATENT AND TRADEMARK OFFICE
CERTIFICATE OF CORRECTION

PATENT NO. : 4,458,293
DATED : July 3, 1984
INVENTOR(S) : Walter L. Cherry

It is certified that error appears in the above-identified patent and that said Letters Patent is hereby corrected as shown below:

In the specification, column 1, line 30, delete "then" and insert therefor --than--;

column 2, line 41, after "and" insert --the--.

Signed and Sealed this

Fourteenth Day of October, 1986

[SEAL]

*Attest:*

DONALD J. QUIGG

*Attesting Officer*  *Commissioner of Patents and Trademarks*